United States Patent
Hayashi

(10) Patent No.: US 7,301,277 B2
(45) Date of Patent: Nov. 27, 2007

(54) ELECTRO-OPTICAL APPARATUS, MANUFACTURING METHOD THEREOF, AND ELECTRONIC INSTRUMENT

(75) Inventor: Kenji Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/285,542

(22) Filed: Nov. 1, 2002

(65) Prior Publication Data

US 2003/0085654 A1    May 8, 2003

(30) Foreign Application Priority Data

Nov. 2, 2001 (JP) ............................. 2001-338045

(51) Int. Cl.
  *H01J 1/62* (2006.01)
  *H01J 63/04* (2006.01)
  *B05D 5/12* (2006.01)
(52) U.S. Cl. .................... 313/506; 313/498; 427/58; 427/123; 427/125; 427/126.5; 427/162
(58) Field of Classification Search .......... 118/718, 118/633, 65, 67–68; 204/298.24; 313/506, 313/498; 427/58, 123, 125, 126.5, 162
See application file for complete search history.

(56) References Cited

U.S. PATENT DOCUMENTS

| | | | | |
|---|---|---|---|---|
| 1,485,254 A * | 2/1924 | Dickie | .......................... | 118/67 |
| 1,944,822 A * | 1/1934 | Church | ........................ | 427/118 |
| 2,445,372 A * | 7/1948 | Trenbath | .................... | 205/86 |
| 3,848,341 A * | 11/1974 | Linder | .......................... | 34/447 |
| 4,845,405 A * | 7/1989 | Yamane et al. | ............. | 313/500 |
| 5,364,481 A * | 11/1994 | Sasaki et al. | ............... | 118/718 |
| 5,527,396 A * | 6/1996 | Saitoh et al. | ......... | 118/723 MP |
| 5,757,126 A | 5/1998 | Harvey, III et al. | | |
| 5,952,778 A * | 9/1999 | Haskal et al. | ................ | 313/504 |
| 5,962,959 A * | 10/1999 | Iwasaki et al. | .............. | 313/310 |
| 5,980,975 A * | 11/1999 | Nomura et al. | ................ | 427/10 |
| 6,137,459 A * | 10/2000 | Eida et al. | ...................... | 345/76 |
| 6,195,142 B1 | 2/2001 | Gyotoku et al. | | |
| 6,198,217 B1 | 3/2001 | Suzuki et al. | | |
| 6,413,645 B1 * | 7/2002 | Graff et al. | .................. | 428/446 |
| 6,433,487 B1 * | 8/2002 | Yamazaki | ................. | 315/169.3 |
| 6,522,067 B1 * | 2/2003 | Graff et al. | .................. | 313/512 |
| 6,537,688 B2 * | 3/2003 | Silvernail et al. | ........... | 428/690 |
| 6,547,920 B2 * | 4/2003 | Gatica et al. | ............. | 156/345.2 |
| 6,570,325 B2 * | 5/2003 | Graff et al. | .................. | 313/506 |
| 6,605,826 B2 * | 8/2003 | Yamazaki et al. | ............ | 257/72 |
| 6,621,213 B2 * | 9/2003 | Kawashima | ................. | 313/506 |
| 6,633,123 B2 * | 10/2003 | Tazawa | ...................... | 313/506 |
| 6,635,989 B1 * | 10/2003 | Nilsson et al. | ............... | 313/512 |
| 6,664,137 B2 * | 12/2003 | Weaver | ....................... | 438/125 |
| 6,689,492 B1 | 2/2004 | Yamazaki et al. | | |

FOREIGN PATENT DOCUMENTS

JP    A-7-111192    4/1995

(Continued)

*Primary Examiner*—Karla Moore
(74) *Attorney, Agent, or Firm*—Oliff & Berridge, PLC

(57) ABSTRACT

The invention achieves a reduction in a thickness while suppressing a thermal effect. An apparatus includes a light-emitting element and a sealing layer to hermetically seal the light-emitting element. The sealing layer includes a heat radiation layer having thermal conductivity.

12 Claims, 2 Drawing Sheets

FOREIGN PATENT DOCUMENTS

| | | |
|---|---|---|
| JP | A-8-185982 | 7/1996 |
| JP | 09161970 A * | 6/1997 |
| JP | 09-180792 A | 7/1997 |
| JP | 10-92583 A | 4/1998 |
| JP | A-10-125463 | 5/1998 |
| JP | A-10-275680 | 10/1998 |
| JP | 10-312883 A | 11/1998 |
| JP | A-11-111452 | 4/1999 |
| JP | A-2001-52873 | 2/2001 |
| JP | A 2001-196165 | 7/2001 |

* cited by examiner (a)

(b)

(c)

ELECTRO-OPTICAL APPARATUS, MANUFACTURING METHOD THEREOF, AND ELECTRONIC INSTRUMENT

BACKGROUND OF THE INVENTION

1. Field of Invention

The present invention relates to an electro-optical apparatus, a manufacturing method thereof, and an electronic instrument having the electro-optical apparatus. More specifically, the invention relates to an electro-optical apparatus having a light-emitting element, such as an organic EL apparatus, a manufacturing method thereof, and an electronic instrument having the electro-optical apparatus.

2. Description of Related Art

A related art electro-optical apparatus, such as a liquid crystal apparatus and an organic EL (electroluminescence) apparatus, may have a plurality of circuit elements, electrodes, liquid crystal elements, or EL elements deposited on a substrate. For example, the organic EL apparatus has a light-emitting element containing a light-emitting substance, and being sandwiched by electrode layers formed of an anode and a cathode, so that it utilizes a light-emitting phenomena of positive holes injected from the anode side and electrons injected from the cathode side, which are rejoined together in a light-emittable light-emitting layer so as to be inactivated from an excited state.

SUMMARY OF THE INVENTION

Such a related art electro-optical apparatus mentioned above, however, has the following problems.

Since the organic EL apparatus having the above-mentioned structure has a current-drive type light-emitting element, a current has to be fed between the anode and the cathode when light is emitted. As a result, the element generates heat when emitting light, and when oxygen and moisture exist around the element, the oxidation of an element material due to the oxygen and moisture is promoted so as to degrade the element. An alkaline metal and alkaline earth metal used especially in the cathode are liable to be oxidized. A typical example of the element degradation due to the oxygen and water is a production of a dark spot and the development thereof. The dark spot means a defective luminous spot. When the degradation of the light-emitting element is accelerated in connection with the driving of the organic EL apparatus, instability with time, such as reducing luminance brightness and luminous instability, and reduced duration of life, have occurred.

Exemplary structures to suppress the above-mentioned degradation include: the light-emitting element being sandwiched by a pair of glass plates using an adhesive so as to seal the element off the atmosphere, and a cooling device being provided to supply cooling fluid on either surface of the substrate, as disclosed in Japanese Unexamined Patent Application Publication No. 2001-196165. In using the glass plate, however, the problem arises that the thickness of the apparatus is increased since at least two glass plates are used. Also, in providing the cooling device, the increase in size of the apparatus cannot be avoided because of the necessity of forming a flow path for the fluid.

The present invention addresses the problems mentioned above, and provides an electro-optical apparatus capable of reducing or suppressing a thermal effect and also having a reduced thickness. The invention also provides a manufacturing method thereof, and an electronic instrument including the electro-optical apparatus.

In order to address or achieve the above, the present invention adopts the following exemplary arrangements.

An electro-optical apparatus according to the present invention includes a light-emitting element and a sealing layer to hermetically seal the light-emitting element. The sealing layer includes a heat radiation layer having thermal conductivity.

Therefore, in the electro-optical apparatus according to the present invention, by hermetically sealing the light-emitting element with the film-shaped sealing layer, the degradation thereof due to oxygen or moisture can be reduced or suppressed without increasing the thickness. Even when heat is generated by the emitting light of the light-emitting element, for example, because the heat can be radiated via the heat radiation layer, a material of the element can be reduced or suppressed against oxidation, enabling the degradation of the light-emitting element to be furthermore reduced or prevented.

The heat radiation layer may be made of a metallic layer, such as film-shaped gold, silver, or copper. In this case, since the thermal conductivity in the gold, silver, and copper is large, the heat produced by light emitting of the light-emitting element can be effectively radiated according to the present invention. By reducing the thickness of the heat radiation layer to 10 nm or less, for example, an excellent light-transmissivity can be obtained especially in the gold and silver. Therefore, when the light produced by the light-emitting element is projected via the sealing layer so as to derive the light from a common electrode, the light can be transmitted with small loss.

The heat radiation layer may also adopt an insulating film to protect the transmission of an alkaline metal. The insulating film may be formed of a material including at least one element selected from B (boron), C (carbon), and N (nitrogen) and at least one element selected from Al (aluminum), Si (silicon), and P (phosphorus), and a material including Si, Al, N, O, and M (where M is at least one kind of rare earth elements, and it is preferably at least one element selected from Ce (cerium), Yb (ytterbium), Sm (samarium), Er (erbium), Y (yttrium), La (lanthanum), Gd (gadolinium), Dy (dysprosium), and Nd (neodymium)). In this case, by arranging the insulating film in the vicinity of the light-emitting element, the blocking effect against moisture and an alkaline metal can be obtained, while the function of an insulating film also having a heat radiation effect can be obtained, enabling the degradation of the light-emitting element to be suppressed.

Also, the present invention may be provided such that one of the gas barrier layer made of an inorganic compound, and the heat radiation layer made of an organic compound, is formed on the upper side of the insulating layer.

Thereby, according to the present invention, by hermetically sealing the light-emitting element with the gas barrier layer, the degradation due to oxygen and moisture can be suppressed without increasing the thickness. Forming a planarized insulating layer also planarizes the gas barrier layer or the heat radiation layer which is formed on the upper side of the insulating layer, preventing the reduction in barrier that is otherwise degraded by strain due to unevenness.

The present invention may be provided such that the organic compound constituting the insulating layer is a polymer. For example, the polymer is made by curing or polymerizing monomers or precursors that were previously applied. Using monomers or precursors with low viscosity forms an excellently planarized polymer layer.

According to the present invention, a gas-permeable protection film may be formed on the upper side of the sealing layer.

Thereby, according to the present invention, the scratching resistance of the sealing layer, and by extension the scratching resistance of the electro-optical apparatus, is enhanced, reducing or preventing damage to the sealing layer and the light-emitting layer due to an external impact. Since the protection film is gas-permeable, the heat produced in the sealing layer is liable to be radiated to the outside of the apparatus. The protection film may be formed on the entire surface of the substrate or may be patterned. In view of contaminant sticking, water absorption, moisture absorption, and impact resistance, the protection film may preferably be a material with low surface-active energy, such as a fluorine polymer, silicone resin, polyolefine resin, and polycarbonate resin.

An electronic instrument according to the present invention includes the electro-optical apparatus described above.

Thereby, according to the present invention, an electronic instrument with a long life span and thin thickness can be obtained, in which the degradation of the light-emitting element is reduced or suppressed.

On the other hand, a manufacturing method of an electro-optical apparatus according to the present invention, the electro-optical apparatus having a light-emitting element, includes forming a sealing layer to hermetically seal the light-emitting element. Forming the sealing layer includes forming a heat radiation layer having thermal conductivity.

Thereby, according to the manufacturing method of the present invention, by hermetically sealing the light-emitting element with the film-shaped sealing layer, the degradation due to oxygen and moisture can be reduced or suppressed without increasing the thickness. Also, even when heat is produced by light emitting of the light-emitting element, for example, because the heat can be radiated via the heat radiating layer, the oxidation of a material of the element can be reduced or suppressed, further reducing or preventing the degradation of the light-emitting element.

According to the present invention, forming the sealing layer may include covering an insulating layer made of an organic compound on the light-emitting element and forming one of a gas barrier layer made of an inorganic compound and the heat radiation layer on the insulating layer.

Thereby, according to the present invention, by hermetically sealing the light-emitting element with the gas barrier layer, the degradation due to oxygen and moisture can be reduced or suppressed without increasing the thickness. Covering the light-emitting element with the insulating layer enables the surface of the insulating layer to be planarized. Therefore, the gas barrier layer formed on the upper side of the insulating layer is also planarized, reducing or preventing the reduction in barrier that is otherwise degraded by strain due to unevenness.

The present invention may be provided such that the organic compound constituting the insulating layer is a polymer. For example, the polymer is made by curing or polymerizing monomers or precursors that were previously applied. Using monomers or precursors with low viscosity forms an excellently planarized polymer layer.

The present invention may also be provided such that the heat radiation layer is formed of a metallic layer such as film-shaped gold, silver, or copper.

Thereby, since the thermal conductivity in the gold, silver, and copper is large, the heat produced by light emitting of the light-emitting element can be effectively radiated according to the present invention. By reducing the thickness of the heat radiation layer to 10 nm or less, for example, excellent light-transmissivity can be obtained, especially in the gold and silver. Therefore, when the light produced by the light-emitting element is projected via the sealing layer so as to derive the light from a common electrode, the light can be transmitted with only a small loss.

The present invention may also include forming a gas-permeable protection film on the upper side of the sealing layer.

Thereby, according to the present invention, the scratching resistance of the sealing layer, and by extension the scratching resistance of the electro-optical apparatus, is enhanced, reducing or preventing damage to the sealing layer and the light-emitting layer due to an external impact. Since the protection film is gas-permeable, the heat produced in the sealing layer is liable to be radiated to the outside of the apparatus. The protection film may be formed on the entire surface of the substrate or may be patterned. In view of contaminant sticking, water absorption, moisture absorption, and abrasion resistance, the protection film may preferably be a material with low surface-active energy, such as a fluorine polymer, silicone resin, polyolefine resin, and polycarbonate resin.

DETAILED DESCRIPTION OF PREFERRED EMBODIMENTS

Exemplary embodiments of an electro-optical apparatus, a manufacturing method thereof, and an electronic instrument according to the present invention are described below with reference to FIGS. 1 and 2.

The electro-optical apparatus according to the present invention is exemplified by an organic EL apparatus in this description.

Figure 1:
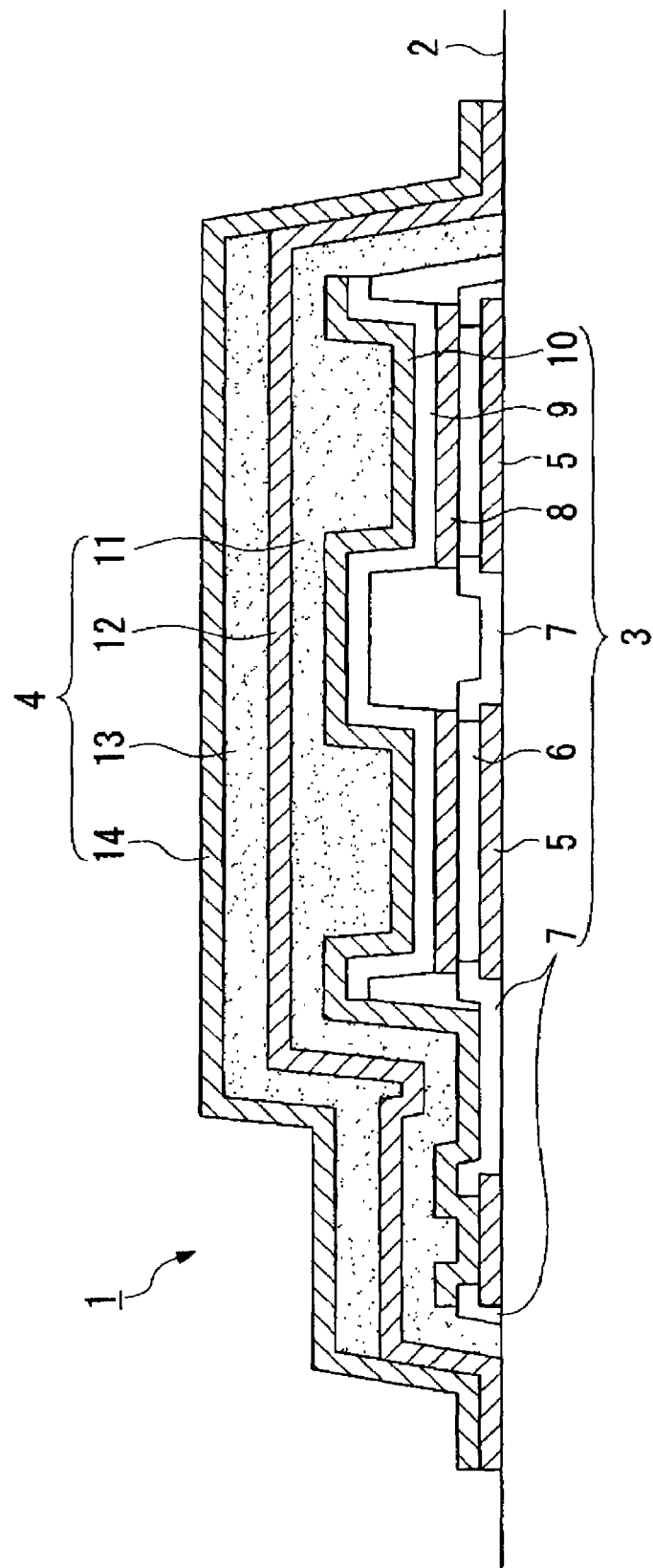
FIG. 1 is a sectional view of a light-emitting element on a substrate sealed with a sealing layer, in accordance with an embodiment of the present invention.
Figure 2:
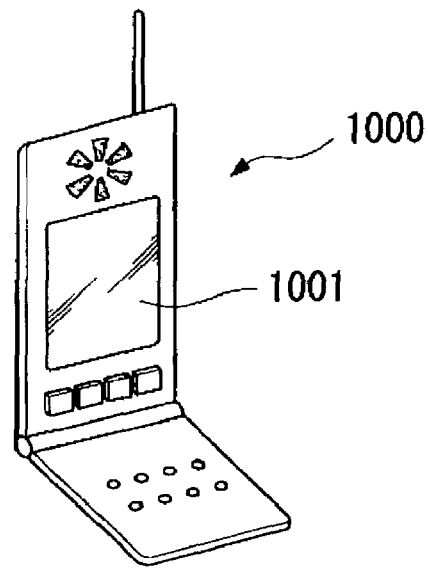
FIGS. 2(a)-2(c) are perspective views that show examples of an electronic instrument having an organic EL apparatus, and include a mobile phone, a watch-type electronic instrument, and a portable information processing apparatus, respectively.
Figure 2:
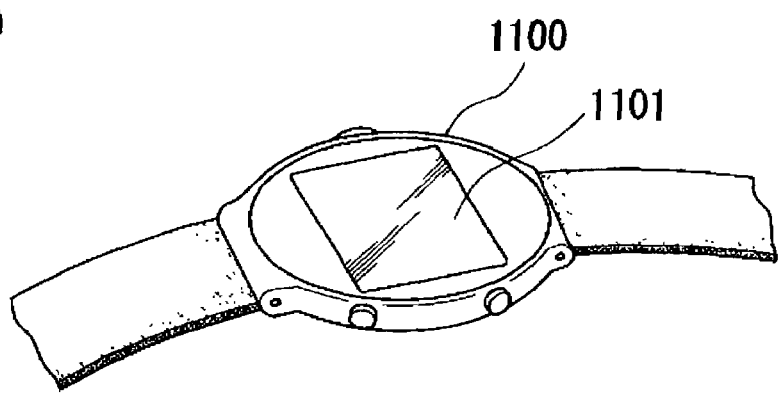
Figure 2:
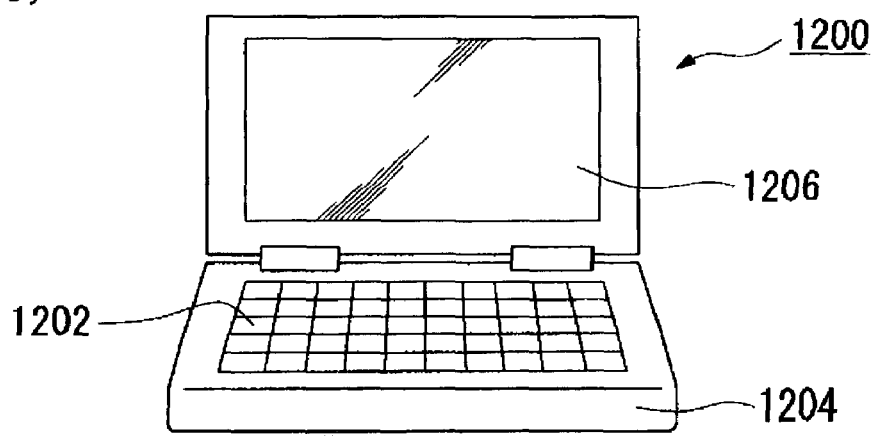

An organic EL apparatus (electro-optical apparatus) 1 shown in FIG. 1 includes a transparent substrate 2, a light-emitting element 3, and a sealing layer 4 to hermetically seal the light-emitting element 3, which are formed on the transparent substrate 2. The transparent substrate 2 can be made of plastics, such as polyolefins, polyesters, polyacrylate, polycarbonate, polyethersulfone, and polyetherketone, and transparent materials, such as glass, for example. According to the exemplary embodiment, glass is used.

The light-emitting element 3 substantially includes an anode 5 formed on the transparent substrate 2, a hole-transporting layer 6, an insulating layer 7 formed so as to expose a surface of the anode 5 joining to the hole-transporting layer 6, an organic light-emitting layer 8, an electron-transporting layer 9, and a cathode 10.

The anode 5 can be formed of elemental substances, such as aluminum (Al), gold (Au), silver (Ag), magnesium (Mg), nickel (Ni), zinc-vanadium (Zn—V), indium (In), and tin (Sn); a compound or mixture of these elemental substances; and a conductive adhesive containing a metallic filler, for example. According to the embodiment, ITO (indium tin oxide) is used. The anode 5 is preferably formed by sputtering, ion plating, or vacuum deposition. It may also be formed by printing with a spin coater, gravure coater, or knife coater; screen printing; or flexography. It is preferable that the light transmittance of the anode 5 be set to be 80% or more.

The hole-transporting layer 6 may be formed by co-depositing a carbazole polymer and a TPD (triphenyl compound) so as to have a film thickness in the range of 10 nm to 1000 nm (100 nm to 700 nm, more preferably), for example. As an alternative process, the hole-transporting layer 6 may be formed on the anode 5 by drying and heating treatments after positive-hole injecting and ejecting an ink composition containing a transporting material onto the anode 5 by an inkjet method, for example. A mixture of a polythiophenic derivative, such as polyethylenedioxythiophene and polystyrenesulfonic acid, may be used as the ink composition by dissolving it into a polar solvent, such as isopropyl alcohol.

The insulating film 7 may be patterned using a photolithographic and an etching technology after depositing $SiO_2$ on the entire surface of the substrate by a CVD method.

The organic light-emitting layer 8, as with the hole-transporting layer 6, may be formed on the hole-transporting layer 6 by drying and heating treatments after ejecting an ink composition containing a light-emitting layer material onto the hole-transporting layer 6 by an inkjet method. Light-emitting materials for use in the organic light-emitting layer 8 may include a fluorenyl polymer derivative, a (poly) paraphenylenevinylene derivative, a polyphenylene derivative, a polyfluorene derivative, polyvinylcarbazole, a polythiophene derivative, perylene coloring matter, coumarin coloring matter, Rhodamine coloring matter, other low-molecular-weight organic EL materials soluble in a benzene derivative, and a polymer organic EL material. In addition, suitable materials for the inkjet method include: a paraphenylenevinylene derivative, a polyphenylene derivative, a polyfluorene derivative, polyvinylcarbazole, and a polythiophene derivative, for example. Suitable materials for mask vacuum deposition include perylene coloring matter, coumarin coloring matter, and Rhodamine coloring matter, for example.

Also, the electron-transporting layer 9 may be formed by evaporating and depositing a metallic complex compound made from a metal and organic ligand, which are preferably Alq3 (tris(8-quinolinolate)aluminum complex), Znq2 (bis (8-quinolinolate)zinc complex), Bebq2 (bis(8-quinolinolate) berilium complex), Zn-BTZ (2-(ohydroxyphenyl)benzothiazolezinc), and a perylene derivative so as to have a film thickness in the range of 10 nm to 1000 nm (100 nm to 700 nm, more preferably).

The cathode 10 may be formed by a metal having a low work function capable of efficiently injecting electrons into the electron-transporting layer 9, which preferably includes elemental substances, such as Ca, Au, Mg, Sn, In, Ag, Li, and Al; or alloys of these elemental substances, for example. According to the embodiment, the cathode 10 employs a double layer system of a cathode using mainly Ca and a reflection layer using mainly Al.

Although not shown, the organic EL apparatus according to the embodiment is of an active matrix type, in practice, in which a plurality of data lines and a plurality of scanning lines are arranged in a lattice, and to each of pixels that are defined by the data lines and the scanning lines and arrayed in a matrix arrangement, the light-emitting element 3 is connected via a driving TFT such as a switching transistor and a driving transistor. When a driving signal is supplied via the data line or scanning line, a current passes through between electrodes, so that the light-emitting element 3 emits light toward the outside of the transparent substrate 2 so as to turn on the pixel. In addition, it is obvious that not only the active matrix type but also a passive driving type display may be incorporated into the present invention.

The sealing layer 4 is formed by sequentially depositing an insulating layer 11 covering the light-emitting element 3, a gas barrier layer 12, an insulating layer 13, and a heat radiation layer 14 on the light-emitting element 3.

The insulating layers 11 and 13 are fabricated by an organic polymer. Specifically, as the insulating layers 11 and 13, polyacrylate, polymethacrylate, PET, polyethylene, or polypropylene; or the combination of these polymers, may be used, for example.

The gas barrier layer 12 is made of an inorganic compound having gas-barrier properties, such as an inorganic oxide, an inorganic nitride, and an inorganic carbide. Specifically, as the gas barrier layer 12, indium oxide ($In_2O_3$), tin oxide ($SnO_2$), or the above-mentioned ITO; or the combination of these compounds, may be used, for example. Silicon oxide ($SiO_2$), aluminum oxide ($Al_2O_3$), titanium oxide ($TiO_3$), aluminum nitride (AlN), silicon nitride (SiN), silicon carbide (SiC), silicon oxynitride (SiON), and diamond-like carbon (DLC); and the combination of these compounds, can also be used.

The heat radiation layer 14 is made of a metallic film with a high coefficient of thermal conductivity, such as gold (Au), silver (Ag), and copper (Cu). The relationship between the thermal conductivity $\lambda$ and the electrical conductivity $\nu$ at the same temperature of the metal satisfies that $\lambda/\sigma$=constant according to the Wiedemann-Franz law. Therefore, for a metal having a high thermal conductivity, a metal having a high electrical conductivity may be selected, so that the above-mentioned gold, silver, and copper may be selected. These metals include metals that are liable to be oxidized and that are very expensive, so an alloy of two or more of them or an alloy of them to which metallic elements, such as zinc, tin, and aluminum, can be added to the extent that does not change the thermal conductivity very much.

A manufacturing process of the sealing layer 4 structured as above (sealing-layer forming process) is described below. First, organic monomer is applied by spray coating, etc., so as to cover the light-emitting element 3, and then cured and polymerized to form the insulating layer 11. Then, by vacuum deposition, low-temperature sputtering, and CVD, the gas barrier layer 12 made of an inorganic compound is formed on the insulating layer 11 (partly on the substrate 2). Since the insulating layer 11 is formed as an active precursor by curing the organic monomer applied, the top surface thereof (surface on which the gas barrier layer 12 is formed) is planarized. Therefore, the gas barrier layer 12 is also planarized following the insulating layer 11. Then, the insulating layer 13 is formed by the same process as the insulating layer 11.

Consecutively, the heat radiation layer 14 made of a metallic film is formed (film-formed) on the insulating layer 13 (partly on the gas barrier layer 12). The heat radiation layer 14, as with the gas barrier layer 12, is formed by vacuum deposition, low-temperature sputtering, or CVD. Since the insulating layer 13 is the organic polymer formed on the planarized gas barrier layer 12, the top surface thereof is planarized, so that the heat radiation layer 14 formed on the insulating layer 13 is also planarized. Although not shown, the heat radiation layer 14 is connected to a heatsink so as to efficiently radiate the transmitted heat. In manufacturing the gas barrier layer 12 and the heat radiation layer 14, the cost is reduced by using the same common mask.

In the organic EL apparatus 1 arranged as described above, the light-emitting element 3 is sealed by the sealing layer 4 having the gas barrier layer 12, so that degradation due to oxygen or moisture is reduced or suppressed. Also, the heat generated in the light-emitting element 3 is transmitted to the heat radiation layer 14 and radiated via the insulating layer 11, the gas barrier layer 12, and the insulating layer 13 (partly via the insulating layer 11 and the gas barrier layer 12).

In such a manner, according to the embodiment, the factors of degradation of the light-emitting element 3 or an electrode, such as oxygen and moisture, are sealed with the film-shaped sealing layer 4, and the heat produced in the light-emitting element 3 is radiated therewith, so that the degradation of the light-emitting element 3 or the electrode due to oxygen, moisture, and heat can be reduced or suppressed without increasing the thickness, so that an organic EL apparatus 1 with a thin thickness and long life span can be provided.

According to the embodiment, since on the insulating layers 11 and 13 made of an organic polymer, the gas barrier layer 12 and the heat radiating layer 14 are respectively formed, the gas barrier layer 12 and the heat radiating layer 14 are planarized, preventing the reduction in barrier in advance, which is otherwise degraded by strain due to unevenness.

Next, examples of electronic instruments having the organic EL apparatus 1 according to the embodiment will be described.

FIG. 2(a) is a perspective view showing an example of a mobile phone. In FIG. 2(a), numeral 1000 denotes a mobile phone body, and numeral 1001 denotes a display using the organic EL apparatus 1.

FIG. 2(b) is a perspective view showing an example of a watch-type electronic instrument. In FIG. 2(b), numeral 1100 denotes a watch body, and numeral 1101 denotes a display using the organic EL apparatus 1.

FIG. 2(c) is a perspective view showing an example of a portable information processing apparatus, such as a word processor and personal computer. In FIG. 2(c), numeral 1200 denotes the information processing apparatus, numeral 1202 denotes an input unit such as a keyboard, numeral 1204 denotes an information-processing apparatus body, and numeral 1206 denotes a display using the organic EL apparatus 1.

The electronic instruments shown in FIGS. 2(a) to 2(c) include the organic EL apparatuses 1 according to the embodiment, enabling an electronic instrument having an organic EL display with a thin thickness and long life span to be provided.

In addition, the technical scope of the present invention is not limited to the embodiments described above, and various modifications may be made within the spirit of the present invention.

For example, according to the embodiment, the insulating layer 13 is arranged between the gas barrier layer 12 and the heat radiation layer 14. However, the insulating layer 13 is not necessarily needed, so that the heat radiation layer 14 may also be directly arranged on the gas barrier layer 12. The positional arrangement between the gas barrier layer 12 and the heat radiation layer 14 shown in the embodiment is an example. Contrarily, the heat radiation layer 14 may be formed on the insulating layer 11 while the gas barrier layer 12 may be formed on the insulating layer 13. However, the arrangement that the heat radiation layer 14 is exposed to the outside increases the surface area of the exposing atmosphere, if the heat radiation effect is considered, the arrangement shown in the embodiment is preferable.

Also, according to the embodiment described above, the heat radiation layer 14 is formed of a metallic film. However, the invention is not limited to this arrangement, and an insulating film protecting the transmission of an alkaline metal may be adopted. The insulating film may be formed of a material including at least one element selected from B (boron), C (carbon), and N (nitrogen) and at least one element selected from Al (aluminum), Si (silicon), and P (phosphorus), and a material including Si, Al, N, O, and M (where M is at least one kind of rare earth elements, and it is preferably at least one element selected from Ce (cerium), Yb (ytterbium), Sm (samarium), Er (erbium), Y (yttrium), La (lanthanum), Gd (gadolinium), Dy (dysprosium), and Nd (neodymium)), for example. In this case, by arranging the insulating film in the vicinity of the light-emitting element, the blocking effect against moisture and an alkaline metal can be obtained while the function of an insulating film also having a heat radiation effect can be obtained, enabling the degradation of the light-emitting element to be reduced or suppressed.

The insulating layer 11 is formed by applying an organic monomer so as to cover the light-emitting element 3, and curing it to be polymerized. It may be formed by polymerization after an organic monomer is applied. In addition, the specific materials shown in the embodiment are only examples, so that appropriate alternation may be possible.

Furthermore, according to the embodiment, a type of apparatus that emits light by the light-emitting element 3 which projects light to the outside of the apparatus via the transparent substrate 2 is exemplified. Alternatively, a type of apparatus that emits light by the light-emitting element 3 which projects light from the common electrode opposite to the transparent substrate 2 via the sealing layer 4 may be applicable. In this case, when the metallic film constituting the heat radiation layer 14 is gold or silver having high thermal conductivity, the heat is effectively radiated while high light-transmissivity (transparency) can be obtained using a gold film with a thickness of 10 nm or less, enabling an organic EL apparatus with small loss of transmitted light to be obtained.

As described in the embodiment, in an arrangement that the heat radiation layer 14 is exposed on the surface of the sealing layer 4, although it is advantageous in heat radiation, in order to enhance abrasion resistance (scratching resistance), a protection film made of a film or coated layer may be formed on the heat radiation layer 14 (i.e., sealing layer 4). In this case, in view of contaminant sticking, water absorption, moisture absorption, and abrasion resistance, the protection film may preferably be a material with low surface-active energy, such as a fluorine polymer, silicone resin, polyolefine resin, and polycarbonate resin. The protection film may also be formed on the entire surface of the substrate or may be patterned, and furthermore it may preferably have high gas-permeability (1000 $cm^3/m^2$ 24 hr, or more). Thereby, the heat transmitted to the heat radiation layer 14 can be radiated to the atmosphere via the protection film, enhancing a radiation effect.

In addition, according to the embodiment, only one layer of the gas barrier layer 12 is arranged. The invention is not limited to this arrangement and forming two layers or more enables the gas barrier to be more enhanced. In this case, it is preferable that a plurality of units, each unit being constituted by a gas barrier layer and an organic polymer layer (insulating layer), be laid up. Also, not only glass, but also plastics, may be used as the substrate.

As described above, according to the present invention, an electro-optical apparatus with a thin thickness and long life span without reduction in gas barrier, and an electronic instrument having a display with the same capability, can be readily obtained. The present invention also enables an electro-optical apparatus with high heat radiation and abrasive resistance to be obtained, in which light is derived from the common electrode with only a small loss of the transmitted light.

What is claimed is:

1. An electro-optical apparatus, comprising:
   a light-emitting element, the light-emitting element including:
   an anode;
   an insulating layer formed on a first electrode so as to expose a part of the anode;
   an organic light-emitting layer formed above the part of the anode;
   a cathode formed above the organic light-emitting layer and the insulating layer: and
   a sealing layer to hermetically seal the light-emitting element, the sealing layer including:
   a first planarizing insulating layer made of an organic compound and formed above the organic light-emitting layer and the insulating layer, the surface of the first planarizing insulating layer being planarized, the first planarizing layer having a first thickness in a first area, and a second thickness in a second area, the first and second thicknesses being different;
   a gas barrier layer made of an inorganic compound and formed on the first planarizing insulating layer;
   a second planarizing insulating layer made of an organic compound and formed on the gas barrier layer; and
   a heat radiation layer having thermal conductivity and formed on the second planarizing insulating layer, the heat radiation layer contacting the gas barrier layer outside a region where the insulating layer is formed.

2. The electro-optical apparatus according to claim 1, the heat radiation layer being a metallic layer.

3. The electro-optical apparatus according to claim 2, the heat radiation layer being made of one of film-shaped gold, silver, and copper.

4. The electro-optical apparatus according to claim 1, the heat radiation layer being an insulating film.

5. The electro-optical apparatus according to claim 1, further comprising a gas-permeable protection film formed on the upper side of the sealing layer.

6. An electronic instrument, comprising:
   the electro-optical apparatus according to claim 1.

7. A manufacturing method of an electro-optical apparatus with a light-emitting element, comprising:
   forming an anode above a substrate;
   forming an insulating layer on a first electrode so as to expose a part of the anode;
   forming an organic light-emitting layer above the part of the anode;
   forming a cathode above the organic light-emitting layer and the insulating layer;
   forming a sealing layer to hermetically seal the light-emitting element, including:
   forming a first planarizing insulating layer made of an organic compound above the organic light-emitting layer and the insulating layer to planarize the surface of the first planarizing insulating layer, the first planarizing layer having a first thickness in a first area, and a second thickness in a second area, the first and second thicknesses being different;
   forming a gas barrier layer on the first planarizing insulating layer;
   forming a second planarizing insulating layer on the gas barrier layer: and
   forming a heat radiation layer having thermal conductivity on the sec planarizing insulating layer, the heat radiation layer contacting the gas barrier layer outside a region where the insulating layer is formed.

8. The manufacturing method according to claim 7, the forming an insulating layer including forming an insulating layer made of an organic compound that is a polymer.

9. The manufacturing method according to claim 7, the forming a heat radiation layer including forming a heat radiation layer that is made of one of film-shaped gold, silver, and copper.

10. The manufacturing method according to claim 7, further comprising forming a gas-permeable protection film on the upper side of the sealing layer.

11. The electro-optical apparatus according to claim 1, the sealing layer further including another insulating layer between the gas barrier layer and heat radiation layer.

12. The manufacturing method according to claim 7, the step of forming the sealing layer further including forming another insulating layer between the gas barrier layer and heat radiation layer.

* * * * *